(12) United States Patent
Dussarrat et al.

(10) Patent No.: US 8,357,430 B2
(45) Date of Patent: *Jan. 22, 2013

(54) METHOD FOR PRODUCING SILICON NITRIDE FILMS

(75) Inventors: Christian Dussarrat, Wilmington, DE (US); Jean-Marc Girard, Paris (FR); Takako Kimura, Urayasu (JP)

(73) Assignee: L'Air Liquide Societe Anonyme pour l'Etude et l'Exploitation des Procedes Georges Claude, Paris (JP)

( * ) Notice: Subject to any disclaimer, the term of this patent is extended or adjusted under 35 U.S.C. 154(b) by 1002 days.

This patent is subject to a terminal disclaimer.

(21) Appl. No.: 11/573,727

(22) PCT Filed: Aug. 17, 2005

(86) PCT No.: PCT/EP2005/054064
§ 371 (c)(1),
(2), (4) Date: Feb. 26, 2008

(87) PCT Pub. No.: WO2006/018441
PCT Pub. Date: Feb. 23, 2006

(65) Prior Publication Data
US 2008/0260969 A1    Oct. 23, 2008

(30) Foreign Application Priority Data

Aug. 20, 2004  (JP) ................. 2004-241533

(51) Int. Cl.
*C23C 16/34* (2006.01)
(52) U.S. Cl. ................. 427/255.394; 427/579
(58) Field of Classification Search ............. 427/255.28, 427/255.394, 579
See application file for complete search history.

(56) References Cited

U.S. PATENT DOCUMENTS

| | | | |
|---|---|---|---|
| 4,200,666 A | | 4/1980 | Reinberg |
| 4,595,775 A | * | 6/1986 | Arkles .................... 556/409 |
| 4,882,256 A | * | 11/1989 | Osawa et al. .................... 430/66 |
| 6,333,547 B1 | * | 12/2001 | Tanaka et al. ................. 257/649 |
| 6,503,557 B1 | * | 1/2003 | Joret ............................. 427/167 |
| 6,566,281 B1 | | 5/2003 | Buchanan et al. |
| 6,630,413 B2 | * | 10/2003 | Todd ............................ 438/795 |
| 7,192,626 B2 | * | 3/2007 | Dussarrat et al. ...... 427/255.394 |
| 7,510,984 B2 | * | 3/2009 | Saito et al. .................... 438/791 |
| 7,651,955 B2 | * | 1/2010 | Ranish et al. ................. 438/769 |
| 2006/0286774 A1 | * | 12/2006 | Singh et al. ................... 438/478 |
| 2006/0286817 A1 | * | 12/2006 | Kato et al. .................... 438/791 |

FOREIGN PATENT DOCUMENTS

| | | | |
|---|---|---|---|
| JP | 2001 168092 | | 6/2001 |
| WO | WO 2004 030071 | | 4/2004 |
| WO | WO2004/030071 | * | 4/2004 |
| WO | WO 2011/007323 | * | 1/2011 |

OTHER PUBLICATIONS

Wells, Richard I., et al., "Studies of Silicon-Nitrogen Compounds. The Base-Catalyzed Elimination of Silane from Trisilylamine". Journal of American Chemical Society 88:1 Jan. 5, 1966, pp. 1-6.*
Malkow, Thomas, "Critical observations in the research of carbon nitride". Materials Science and Engineering A, A302 (2001) 311-324.*
International Search Report for PCT/EP2005/054064.
Patent Abstracts of Japan vol. 1995, No. 03, Apr. 28, 1995, & JP 06 338497, Dec. 6, 1994.
Copel M., et al. *"Nucleation of chemical vapor deposited silicon nitride on silicon dioxide"*. Applied Physics Letters, API, Melville, NY, vol. 74, No. 13, Mar. 29, 1999, p. 1830.

* cited by examiner

*Primary Examiner* — Bret Chen
(74) *Attorney, Agent, or Firm* — Patricia E. McQueeney

(57) ABSTRACT

(Problem) To provide a method for producing silicon nitride films by vapor deposition that, while employing trisilylamine as precursor, can produce silicon nitride films that exhibit excellent film properties and can do so at relatively low temperatures and relatively high growth rates. (Solution) Method for producing silicon nitride film, said method being characterized by feeding gaseous trisilylamine and gaseous nitrogen source comprising at least two amine-type compounds selected from amine-type compounds with formula (1) $NR^1R^2R^3$ ($R^1$, $R^2$, and $R^3$ are each independently selected from hydrogen and $C_{1-6}$ hydrocarbyl) into a reaction chamber that holds at least one substrate and forming silicon nitride film on said at least one substrate by reacting the trisilylamine and said nitrogen source.

4 Claims, 1 Drawing Sheet

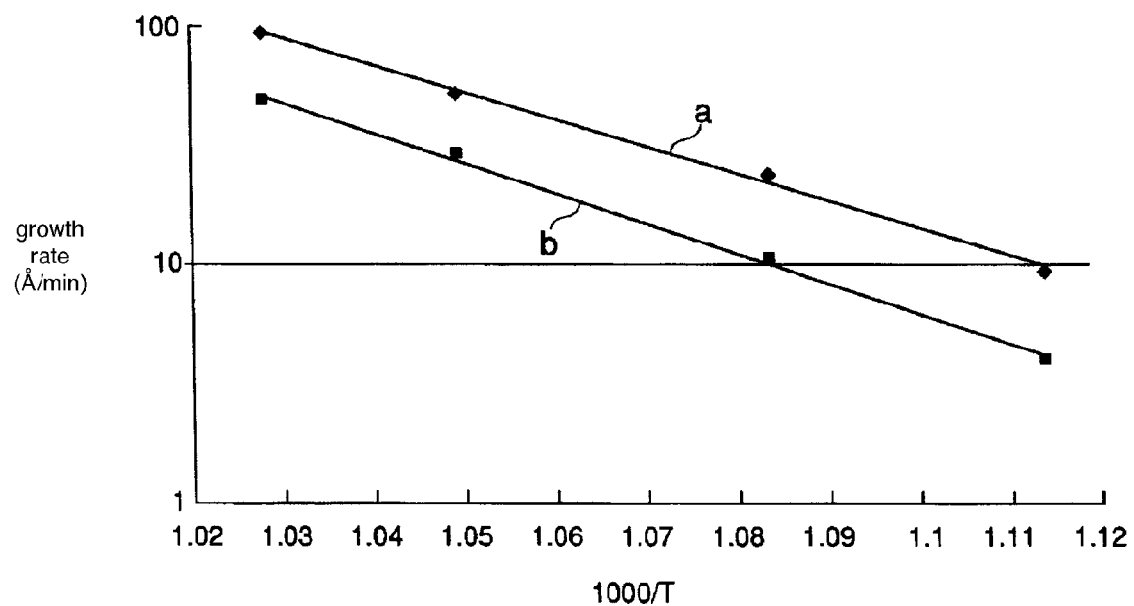

METHOD FOR PRODUCING SILICON NITRIDE FILMS

CROSS REFERENCE TO RELATED APPLICATIONS

This application is a 371 of International PCT Application PCT/EP2005/054064, filed Aug. 17, 2005, which claims priority to Japanese Patent Application No. 2004-241533, filed Aug. 8, 2004, the entire contents of both being incorporated in their entireties herein by reference.

BACKGROUND

1. Field of the Invention

The invention relates to a method for producing silicon nitride films and more particularly relates to a method for producing silicon nitride films by chemical vapor deposition (CVD).

2. Description of the Prior Art

Silicon nitride films have excellent barrier properties and an excellent oxidation resistance and as a consequence are used in the fabrication of microelectronic devices, for example, as an etch-stop layer, barrier layer, or gate dielectric layer, and in oxide/nitride stacks.

Plasma-enhanced CVD (PECVD) and low-pressure CVD (LPCVD) are the methods primarily used at the present time to form silicon nitride films.

PECVD is typically carried out by introducing a silicon source (typically silane) and a nitrogen source (typically ammonia, but more recently nitrogen) between a pair of parallel plate electrodes and applying high-frequency energy across the electrodes at low temperatures (about 300° C.) and low pressures (0.1 torr to 5 torr) in order to induce the generation of a plasma from the silicon source and nitrogen source. The active silicon species and active nitrogen species in the resulting plasma react with each other to produce a silicon nitride film. The silicon nitride films afforded by PECVD typically do not have a stoichiometric composition and are also hydrogen rich and accordingly exhibit a low film density, a fast etching rate, and a poor thermal stability.

In contrast to the preceding, LPCVD uses low pressures (0.1 to 2 torr) and high temperatures (800° C. to 900° C.) and produces silicon nitride films with a quality superior to that of the silicon nitride films produced by PECVD. At the present time silicon nitride is typically produced by LPCVD by the reaction of dichlorosilane and gaseous ammonia. However, ammonium chloride is produced as a by-product in the reaction of dichlorosilane and gaseous ammonia in this LPCVD procedure: this ammonium chloride accumulates in and clogs the reactor exhaust lines and also deposits on the wafer. Moreover, existing LPCVD technology suffers from a slow rate of silicon nitride film growth and has a high thermal budget. In order to reduce this thermal budget associated with the production of silicon nitride films, a method has very recently been developed that produces silicon nitride films by reacting ammonia with hexachlorodisilane used as a silicon nitride precursor. This method, however, suffers from a pronounced exacerbation of the problems cited above due to the large amounts of chlorine present in hexachlorodisilane. Silicon-containing particles are also produced by this method, which results in a substantial reduction in the life of the exhaust lines. Finally, this method can provide good silicon nitride films (high quality, good step coverage ratio, low chlorine content) at excellent growth rates when the reaction temperature is, for example, 600° C., but these characteristics suffer from a pronounced deterioration when a reaction temperature $\leq 550°$ C. is used.

Methods that use trisilylamine as a precursor in the formation of silicon nitride films by CVD have recently been disclosed. Thus, a method is disclosed in U.S. Pat. No. 6,566,281 B1 in which silicon nitride is produced by flowing trisilylamine and ammonia over substrate. A method is disclosed in U.S. Pat. No. 6,630,413 B1 in which silicon nitride film is produced by reacting trisilylamine with a nitrogenous compound such as an amine. Since trisilylamine lacks chlorine, these methods are free of the problems noted above that arise due to the generation of ammonium chloride by-product.

DISCLOSURE OF THE INVENTION

Problems to Be Solved by the Invention

In the case of methods in which trisilylamine is reacted with ammonia as in U.S. Pat. No. 6,566,281 B1, it has been recognized that the rate of silicon nitride film growth is relatively low and that as a rule the resistance to etching with hydrofluoric acid solutions is also not high. While a high rate of silicon nitride film growth is obtained in the case of methods in which trisilylamine is reacted with amine as in U.S. Pat. No. 6,630,413 B1, it has been found that the resulting silicon nitride film incorporates relatively large amounts of carbon and that the resulting silicon nitride readily undergoes oxidation in air.

An object of the invention, therefore, is to provide a method for producing silicon nitride films by vapor deposition that, while employing trisilylamine as precursor, can produce silicon nitride films that exhibit excellent film properties and can do so at relatively low temperatures and relatively high growth rates.

Means Solving the Problems

As a result of extensive investigations into methods for producing silicon nitride films using trisilylamine as a precursor, the inventors discovered that the aforesaid object could be achieved by the use of two or more amine-type compounds of a specific type as the nitrogen source that is reacted with trisilylamine. This invention was achieved based on this discovery.

More specifically, this invention provides a method for producing silicon nitride film, said method being characterized by feeding gaseous trisilylamine and gaseous nitrogen source comprising at least two amine-type compounds selected from amine-type compounds with formula (1)

$$NR^1R^2R^3 \tag{1}$$

($R^1$, $R^2$, and $R^3$ are each independently selected from hydrogen and $C_{1-6}$ hydrocarbyl) into a reaction chamber that holds at least one substrate and forming silicon nitride film on said at least one substrate by reacting the trisilylamine and said nitrogen source.

Advantageous Effects of the Invention

The invention enables the production, at relatively low temperatures and at relatively high growth rates, of silicon nitride films that exhibit excellent film properties. In addition, silicon nitride film produced in accordance with the invention exhibits a high resistance to etching by hydrofluoric acid and essentially does not undergo oxidation even upon exposure to the atmosphere.

BEST MODE FOR CARRYING OUT THE INVENTION

The present invention is described in greater detail hereinbelow.

The invention is directed to a method for forming silicon nitride film on a substrate by a vapor deposition technique such as CVD. The invention uses trisilylamine (($H_3Si$)$_3$N, abbreviated below as TSA) as a silicon nitride precursor and reacts TSA with a nitrogen source that comprises at least two amine-type compounds of a specific type. The nitrogen source used by the invention to form silicon nitride by reaction with TSA in the vapor phase comprises at least two selections from amine-type compounds with formula (1)

$$NR^1R^2R^3 \tag{1}$$

in which $R^1$, $R^2$, and $R^3$ are each independently selected from hydrogen and $C_{1-6}$ hydrocarbyl (this at least two amine-type compounds with formula (1) is referred to hereinbelow as the "designated nitrogen source"). The hydrocarbyl represented by $R^1$, $R^2$, and $R^3$ in formula (1) may have a cyclic or chain (straight chain or branched chain) structure and can be non-exhaustively exemplified by methyl, ethyl, propyl (n-propyl, isopropyl), butyl (n-butyl, isobutyl, and tert-butyl), pentyl, hexyl, and phenyl. Amine-type compounds with formula (1) can be specifically exemplified by ammonia, monomethylamine, dimethylamine, trimethylamine, monoethylamine, diethylamine, and triethylamine. The combination of ammonia with another amine-type compound is a preferred designated nitrogen source, while the combination of ammonia with trimethylamine is an even more preferred designated nitrogen source.

Silicon nitride film is produced according to the invention on a substrate by feeding gas-phase TSA and gas-phase designated nitrogen source into a reaction chamber that holds at least one substrate (a semiconductor substrate such as a silicon substrate) and reacting the TSA and designated nitrogen source. An inert dilution gas can also be introduced at this time as necessary or desired. The inert dilution gas may be introduced independently from the TSA and designated nitrogen source or may be introduced after it has been preliminarily mixed with the TSA and/or the designated nitrogen source.

The pressure within the reaction chamber can be maintained at 0.1 torr to 1000 torr and is preferably maintained at from 0.1 torr to 10 torr during the reaction between TSA and the designated nitrogen source (the CVD reaction).

The CVD reaction under consideration can generally be carried out at 300° C. to 900° C. (CVD reaction temperature). The CVD reaction temperature generally denotes the temperature of the substrate on which the silicon nitride is formed or the temperature in the neighborhood of this substrate.

While the TSA flow rate will also depend on the size of the reaction chamber, this parameter is generally from 0.5 sccm to 1000 sccm. The TSA and designated nitrogen source can be delivered into the reaction chamber generally at a flow rate ratio of the former to the latter of 1:10 to 1:200. The produced film tends to approach the stoichiometric composition when the designated nitrogen source flow rate is no more than 200-times the TSA flow rate, but tends to be silicon-rich when the flow rate of the designated nitrogen source is less than 10-times the TSA flow rate. The Si/(N+C) ratio in the produced film can be adjusted at TSA: designated nitrogen source flow rate ratios of 1:10 to 1:200, thereby enabling the production of film with desired properties. TSA: designated nitrogen source flow rate ratios of 1:20 to 1:100 are particularly preferred.

The flow rate ratio for the at least two amine-type compounds comprising the designated nitrogen source is not critical, but is generally 1:10 to 10:1 and more preferably is 1:2 to 1:1. In the specific case of the use of ammonia with another amine-type compound, the ammonia: other amine-type compound flow rate ratio is preferably 1:10 to 10:1 and more preferably is 1:2 to 2:1.

The inert dilution gas introduced into the reaction chamber as necessary or desired can be a single selection or two or more selections from inert gases such as nitrogen and rare gases such as argon.

Neither TSA nor the designated nitrogen source used by the invention contain chlorine, and their reaction therefore does not result in the secondary production of ammonium chloride that has been a problem with the prior art. The use in accordance with the present invention of two or more amine-type compounds for reaction with TSA provides a significant improvement in the rate of silicon nitride film growth over the rate afforded by the reaction of TSA with ammonia alone. Moreover, the silicon nitride film afforded by the reaction of TSA with at least two amine-type compounds in accordance with the invention exhibits an excellent oxidation resistance upon exposure to air (essentially no oxidation occurs), which is superior to that of film afforded by the reaction of TSA with only a non-ammonia amine-type compound such as trimethylamine. The silicon nitride film afforded by the reaction of TSA with at least two amine-type compounds in accordance with the invention also exhibits a high resistance to etching by hydrofluoric acid and advantageously supports selective etching post-film production. Synergistic effects such as these appear due to the reaction of TSA with two or more amine-type compounds in accordance with the present invention.

EXAMPLES

Examples of the invention are described below, but this invention is not limited by these examples.

Example 1

Silicon nitride film was produced at different CVD reaction temperatures (T) on silicon substrate held in a reaction chamber by delivering T SA gas into the reaction chamber at a feed flow rate of 0.5 sccm, ammonia at a feed flow rate of 40 sccm, and trimethylamine (TMA) at a feed flow rate of 40 sccm while maintaining a pressure of 1 torr in the reaction chamber. The silicon nitride deposition (growth) rate was measured during film production and was plotted against 1000× the reciprocal of the reaction temperature (T in kelvin (K)). The results are plotted as line a in FIG. 1.

Comparative Example 1

Silicon nitride film was produced on silicon substrate entirely as in Example 1, with the exception that nitrogen was introduced into the reaction chamber at a feed flow rate of 40 sccm in place of the TMA. The rate of silicon nitride growth is shown by line b in FIG. 1.

As may be understood from the results reported in FIG. 1, the use of two amine-type compounds (ammonia and TMA) as the nitrogen source (Example 1, line a) provides a substantial improvement in the rate of silicon nitride film growth over the rate provided by the use of only ammonia as the nitrogen source (Comparative Example 1, line b).

Example 2

Silicon nitride was grown on silicon substrate in a reaction chamber using the following CVD reaction conditions.

<CVD Reaction Conditions>
TSA flow rate: 0.5 sccm
ammonia flow rate: 20 sccm
TMA flow rate: 20 sccm
pressure in the reaction chamber: 100 torr
CVD reaction temperature: 500° C.

The resulting rate of silicon nitride growth was 102 Å/min. The obtained silicon nitride film was exposed to the atmosphere for 1 week, after which time the oxygen concentration in the silicon nitride film was measured by Auger electron spectroscopic analysis. It was found as a result that there was almost no oxygen in the film. In addition, the carbon concentration in the film was $\leqq 5$ atom %.

An etching rate of less than 1 Å/min was observed when the obtained silicon nitride was immersed in 1% hydrofluoric acid. The silicon nitride film obtained according to the present invention was therefore confirmed to have an excellent resistance to etching with hydrofluoric acid (refer to the results in Comparative Example 2).

Examples 3 and 4

Silicon nitride films were deposited using the same CVD reaction conditions as in Example 2, but in these examples using reaction temperatures of 490° C. and 480° C. The rate of silicon nitride film growth was 20 Å/min in the former case and was 4.4 Å/min in the latter case. This confirmed that execution of this invention can provide satisfactory silicon nitride film growth even at temperatures as low as less than 500° C.

Comparative Example 2

Silicon nitride film was deposited using the same CVD conditions as in Example 2, but in this comparative example using only ammonia at a flow rate of 40 sccm in place of both the 20 sccm TMA and 20 sccm ammonia. The resulting rate of silicon nitride film growth was 11 Å/min, which was no more than about one-tenth the growth rate in Example 2.

The etching rate of the obtained silicon nitride when immersed in 1% hydrofluoric acid was 8.3 Å/min.

Comparative Example 3

Silicon nitride film was deposited using the same CVD conditions as in Example 2, but in this comparative example using only a flow rate of 40 sccm TMA in place of both the 20 sccm ammonia and 20 sccm TMA. The resulting rate of silicon nitride film growth was 95 Å/min, and the carbon concentration in the film was approximately 25 atom %.

When the obtained silicon nitride film was exposed to the atmosphere, the oxygen concentration in the silicon nitride film after 1 day (determined by Auger electron spectroscopic analysis) was approximately 20 atom %, which confirmed a high sensitivity to air (low resistance to oxidation).

Comparative Example 4

The attempt was made to deposit silicon nitride film using the same CVD conditions as in Example 2, but in this comparative example using a CVD reaction temperature of 490° C. and using only a flow rate of 40 sccm ammonia in place of both the 20 sccm ammonia and 20 sccm TMA. However, silicon nitride production did not occur under these conditions.

BRIEF DESCRIPTION OF THE DRAWINGS

FIG. 1 contains a graph that shows the relationship between the CVD reaction temperature and the rate of silicon nitride film growth.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A CVD method for producing silicon nitride film, said method being characterized by feeding gaseous trisilylamine and gaseous nitrogen source comprising $NH_3$ and $NMe_3$ into a reaction chamber that holds at least one substrate and forming silicon nitride film on said at least one substrate by reacting the trisilylamine and said nitrogen source in a CVD method, wherein the silicon nitride film contains $\leqq 5$ atomic % C.

2. The method described in claim 1, wherein the reaction between the trisilylamine gas and nitrogen source is carried out at 300° C. to 900° C.

3. The method described in claim 1, wherein a pressure of 0.1 torr to 1000 torr is established within the reaction chamber.

4. The method of claim 1, wherein inert dilution gas is also fed to the reaction chamber.

* * * * *